United States Patent
Deng

(10) Patent No.: US 11,099,481 B2
(45) Date of Patent: Aug. 24, 2021

(54) MASK PLATE, ARRAY SUBSTRATE, AND PREPARATION METHOD THEREOF

(71) Applicant: Shenzhen China Star Optoelectronics Semiconductor Display Technology Co., Ltd., Guangdong (CN)

(72) Inventor: Zhuming Deng, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 512 days.

(21) Appl. No.: 16/100,194

(22) Filed: Aug. 9, 2018

(65) Prior Publication Data

US 2019/0278181 A1  Sep. 12, 2019

Related U.S. Application Data

(63) Continuation of application No. PCT/CN2018/084031, filed on Apr. 23, 2018.

(30) Foreign Application Priority Data

Mar. 9, 2018 (CN) .......................... 201810195921.6

(51) Int. Cl.
| | | |
|---|---|---|
| G03F 1/50 | (2012.01) | |
| G03F 7/20 | (2006.01) | |
| G02B 5/20 | (2006.01) | |
| H01L 27/12 | (2006.01) | |
| G03F 1/54 | (2012.01) | |

(52) U.S. Cl.
CPC .............. *G03F 7/20* (2013.01); *G02B 5/201* (2013.01); *G03F 1/50* (2013.01); *G03F 1/54* (2013.01); *H01L 27/1262* (2013.01); *H01L 27/1288* (2013.01)

(58) Field of Classification Search
CPC . G03F 1/50; G03F 1/54; G03F 7/0007; G02B 5/201; G02B 5/223; G02F 1/133514; G02F 1/133516

USPC .......................................................... 430/5, 7
See application file for complete search history.

(56) References Cited

U.S. PATENT DOCUMENTS

2019/0384160 A1* 12/2019 Yang ........................ G03F 1/50

FOREIGN PATENT DOCUMENTS

| CN | 102955378 | A |   | 3/2013 |
|---|---|---|---|---|
| CN | 104155845 | A |   | 11/2014 |
| CN | 204536727 |   | * | 8/2015 |
| CN | 104932138 | A |   | 9/2015 |
| CN | 105448699 | A |   | 3/2016 |
| CN | 106444190 | A |   | 2/2017 |
| CN | 107167937 | A |   | 9/2017 |
| CN | 107479286 | A |   | 12/2017 |
| CN | 107703714 |   | * | 2/2018 |
| JP | 5402316 | B2 |   | 11/2013 |

OTHER PUBLICATIONS

Computer-generated translation of CN 204536727 (Aug. 2015) (Year: 2015).*
First Office Action of counterpart Chinese Patent Application No. 201810195921.6 dated Nov. 27, 2019.

* cited by examiner

*Primary Examiner* — John A McPherson

(57) ABSTRACT

The present disclosure provides a mask plate, an array substrate and, a preparation method thereof. The mask plate may include: at least one first light-transmitting region and at least two second light-transmitting regions arranged on the mask plate and spaced apart; the at least two second light-transmitting regions located at two sides of the at least one first light-transmitting region, respectively; an area of one of the at least two second light-transmitting regions being greater than an area of one of the at least one first light-transmitting region in a direction of a surface of the mask plate.

6 Claims, 3 Drawing Sheets

MASK PLATE, ARRAY SUBSTRATE, AND PREPARATION METHOD THEREOF

CROSS-REFERENCE TO RELATED APPLICATIONS

The present application is a continuation-application of International (PCT) Patent Application No. PCT/CN2018/084031, field on Apr. 23, 2018, which claims foreign priority of Chinese Patent Application No. 201810195921.6, field on Mar. 9, 2018 in the State Intellectual Property Office of China, the entire contents of which are hereby incorporated by reference.

FIELD

The described embodiments relate to a technology of a display, and more particularly, to a mask plate, an array substrate, and a preparation method thereof.

BACKGROUND

In a liquid crystal display panel, some of color resist blocks are formed by a full exposure, and another color resist blocks is formed by a partial exposure. A thickness of the color resist block formed by the full exposure is greater than a thickness of the color resist block formed by the partial exposure. In addition, it is generally required that a thickness difference between the color resist block formed by the two exposure modes is in a range of 0.4 to 0.6 micrometers.

For a mask plate used in the related art, light-transmitting regions and mask regions on two sides of the mask plate are the same as light-transmitting regions and mask regions in the a middle of the mask plate, so that a thickness of the color resist block formed by the partial exposure is thin in edges but is thick in the middle. The non-uniform color resist block that is thin in the edges but thick in the middle is easily peeled off, and a display quality of the liquid crystal panel is affected.

Therefore, a mask plate, an array substrate, and a preparation method thereof may be provided to solve the above-mentioned technical problems.

SUMMARY

The present disclosure may provide a mask plate, an array substrate, and a preparation method thereof to solve the above-mentioned technical problems. When a substrate is partially exposed with the mask plate, a color resist block having a uniform thickness may be obtained, and the color resist block may prevent from being peeled off, and the display quality of the liquid crystal panel may be improved.

In order to solve the above-mentioned technical problem, a technical solution adopted by the present disclosure is to provide a mask plate, comprising: at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate.

In order to solve the above-mentioned technical problem, a technical solution adopted by the present disclosure is to provide an array substrate comprising a color resist block, wherein an angle between a side surface of the color resist block and a bottom surface of the color resist block is no less than 70 degrees and less than 90 degrees.

In order to solve the above-mentioned technical problem, a technical solution adopted by the present disclosure is to provide a preparation method for an array substrate, comprising: providing a substrate; coating a color resist layer on the substrate; exposing and curing the color resist layer with a mask plate, wherein the mask layer comprises at least one first light-transmitting region and at least two second light-transmitting regions formed therein and spaced apart to each other; the at least two second light-transmitting regions are located at two sides of the at least one first light-transmitting region, respectively; an area of one of the at least two second light-transmitting regions is greater than an area of one of the at least one first light-transmitting region in a direction of a surface of the mask plate; the at least one first light-transmitting region and the at least two second light-transmitting regions are configured to obtain a uniform thickness of a color resist block in a direction of a surface.

Advantages of the disclosure may follow. As compared with the related art, the present disclosure may provide a mask plate comprising at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate. So that exposure intensity in the edges of the color resist block may be enhanced, thereby the thickness of the edge of the color resist block may be increased, to prevent the color resist block from being peeled off, and the display quality of a liquid crystal panel may be improved.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

In order to form a color resist block having an uniform thickness, a mask plate provided by the present disclosure may comprise: at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate.

Take the following as an example for a detailed description: the first light-transmitting region and the second light-transmitting region having a rectangular opening with a same length, a width of the rectangular corresponding to the second light-transmitting region being greater than a width of the rectangular corresponding to the first light-transmitting region, so that an area of the rectangular corresponding to the second light-transmitting region is greater than an area of the rectangular corresponding to the first light-transmitting region in a direction of a surface of the mask plate.

Figure 1:
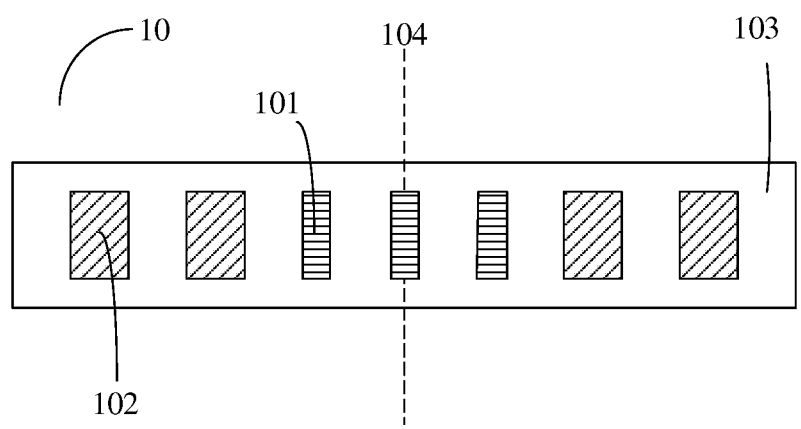
FIG. 1 is a structural illustration of a mask plate in accordance with an embodiment in the present disclosure.

Referring to FIG. 1, FIG. 1 is a structural illustration of a mask plate in accordance with an embodiment in the present disclosure. Three first light-transmitting regions 101, four second light-transmitting regions 102 may be arranged on a mask plate 10, and may be spaced apart by a mask region 103. The second light-transmitting regions 102 may be located at two sides of the first light-transmitting region 101, respectively. The first light-transmitting region and the second light-transmitting region may have a rectangular opening with a same length. The mask plate 10 may comprise an upper surface and a lower surface. A width of the rectangular opening corresponding to the second light-transmitting region 102 may be greater than a width of the rectangular opening corresponding to the first light-transmitting region 101. The width of the rectangular opening corresponding to the second light-transmitting region 102 may be in a range of 4 to 10 micrometers, and the width of the rectangular opening corresponding to the first light-transmitting region 101 may be no greater than 4 micrometers.

In the present embodiment, a distance between the two adjacent second light-transmitting regions 102, a distance between the two adjacent first light-transmitting regions 101, and a distance between the second light-transmitting region 102 and the adjacent first light-transmitting region 101, may be a same length.

In the present embodiment, the four second light-transmitting regions 102 may be arranged on two sides of the first light-transmitting region 101, respectively. Two of the four second light-transmitting regions 102 may be located on one side of a center line 104 of the mask plate 10, and the other of the four second light-transmitting regions 102 may be located on the other side of the center line 104 of the mask plate 10.

In the present embodiment, the two of the four second light-transmitting regions 102 may be arranged on one side of the first light-transmitting region 101, and the other of the four second light-transmitting regions 102 may be arranged on the other side. Other numbers of the second light-transmitting regions 102 may also be arranged on the one side of the first light-transmitting region 101, such as two, three, five or more second light-transmitting regions 102.

In the present embodiment, there may be three first light-transmitting regions 101 arranged on the mask plate 10. In other embodiments, other numbers of the first light-transmitting regions 101 may also be arranged on the mask plate 10, a specific number is not limited here.

In this embodiment, the mask plate 10 may be a chrome metal mask. In other embodiments, a specific material of the mask plate 10 may be selected according to actual conditions.

In the present embodiment, a length of the rectangular corresponding to the first light-transmitting region 101 and a length of the rectangular corresponding to the second light-transmitting region 102 may be a same length. In an actual preparation process, there may be a deviation in a preset range between the length of the rectangular corresponding to the first light-transmitting region 101 and the length of the rectangular corresponding to the second light-transmitting region 102.

In the present embodiment, the first light-transmitting region 101 and the second light-transmitting region 102 may be arranged as a rectangular shape. In other embodiments, the first light-transmitting region 101 and the second light-transmitting region 102 may be also arranged as a shape selected from the group consisting of a circular, a diamond, and hexagonal, it is not limited here.

Figure 2:
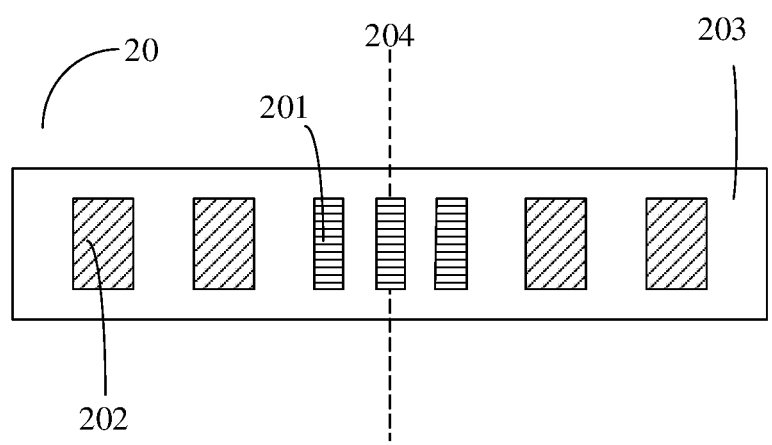
FIG. 2 is a structural illustration of a mask plate in accordance with another embodiment in the present disclosure.

Referring to FIG. 2, FIG. 2 is a structural illustration of a mask plate in accordance with another embodiment in the present disclosure. Three first light-transmitting regions 201, four second light-transmitting regions 202, and a mask region 203 may be arranged on the mask plate 20. A width of a rectangular corresponding to the second light-transmitting region 202 may be greater than a width of a rectangular corresponding to the first light-transmitting region 201. Two of the four second light-transmitting regions 202 may be located on one side of a center line 204 of the mask plate 20, and the other of the four second light-transmitting regions 202 may be located on the other side of the center line 204 of the mask plate 20. The difference between the present embodiment and the previous embodiment is that, the distance between the two adjacent second light-transmitting regions 102, the distance between the two adjacent first light-transmitting regions 101, and the distance between the second light-transmitting region 102 and the adjacent first light-transmitting region 101, may be the same length in the previous embodiment. In the present embodiment, a distance between the two adjacent second light-transmitting regions 202, and a distance between the second light-transmitting region 202 and the adjacent first light-transmitting region 201, may be a same length. A distance between the two adjacent first light-transmitting regions 201 may be less than the distance between the two adjacent second light-transmitting regions 202, and may be less than the distance between the second light-transmitting region 202 and the adjacent first light-transmitting region 201.

In the present embodiment, the distance between the two adjacent second light-transmitting regions 202, the distance between the second light-transmitting region 202 and the adjacent first light-transmitting region 201, may be in a range of 6 to 10 micrometers. The distance between the two adjacent first light-transmitting regions 201 may be no greater than 6 micrometers.

In the present embodiment, the distance between the two adjacent second light-transmitting regions 202, the distance between the second light-transmitting region 202 and the adjacent first light-transmitting region 201, may be 7 micrometers. The distance between the two adjacent first light-transmitting regions 201 may be 6 micrometers. The width of the rectangular corresponding to the second light-transmitting region 202 may be 6 micrometers, and the width of the rectangular corresponding to the first light-transmitting region 201 may be 4 micrometers.

Figure 3:
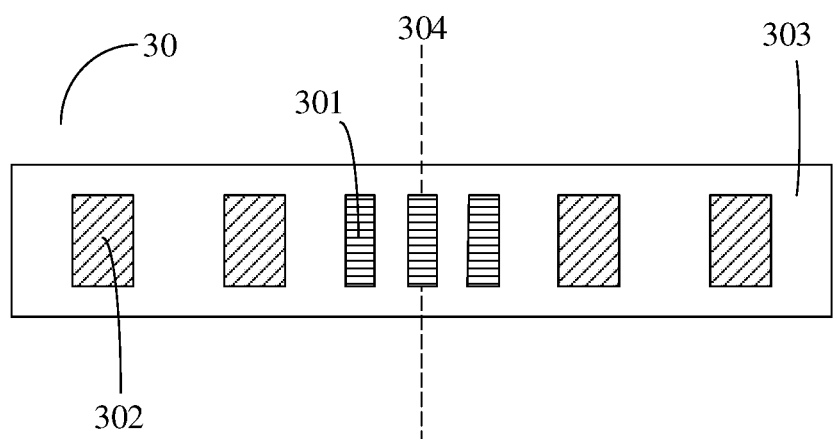
FIG. 3 is a structural illustration of a mask plate in accordance with further another embodiment in the present disclosure.

Referring to FIG. 3, FIG. 3 is a structural illustration of a mask plate in accordance with further another embodiment in the present disclosure. Three first light-transmitting regions 301, four second light-transmitting regions 302, and a mask region 303 may be arranged on the mask plate 30. A width of a rectangular corresponding to the second light-transmitting region 302 may be greater than a width of a rectangular corresponding to the first light-transmitting region 301. Two of the four second light-transmitting regions 302 may be located on one side of a center line 304 of the mask plate 30, and the other of the four second light-transmitting regions 302 may be located on the other side of the center line 304 of the mask plate 30. The difference between the present embodiment and the previous embodiment is that, in the present embodiment, a distance between the two adjacent second light-transmitting region 302 may be greater than a distance between the second light-transmitting region 302 and the adjacent first light-transmitting region 301, and the distance between the second light-transmitting region 302 and the adjacent first light-transmitting region 301 may be greater than a distance between the two adjacent first light-transmitting regions 301. The distance between the second light-transmitting region 302 and the distance between the second light-transmitting region 302 and the adjacent first light-transmitting region 301 may be in a range of 6 to 10 micrometers.

In the present embodiment, the distance between the two adjacent second light-transmitting region 302 may be in a range of 8 to 10 micrometers, the distance between the second light-transmitting region 302 and the adjacent first light-transmitting region 301 may be in a range of 6 to 8 micrometers; or the distance between the two adjacent second light-transmitting region 302 may be in a range of 9 to 10 micrometers, the distance between the second light-transmitting region 302 and the adjacent first light-transmitting region 301 may be in a range of 6 to 9 micrometers. The distance between the two adjacent first light-transmitting regions 301 may be no greater than 6 micrometers. A specific distance may be selected according to actual conditions, it is not limited here.

As compared with the related art, the present disclosure may provide a mask plate comprising at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate. So that exposure intensity in the edges of the color resist block may be enhanced, thereby the thickness of the edge of the color resist block may be increased, to prevent the color resist block from being peeled off, and the display quality of a liquid crystal panel may be improved.

Figure 4A:
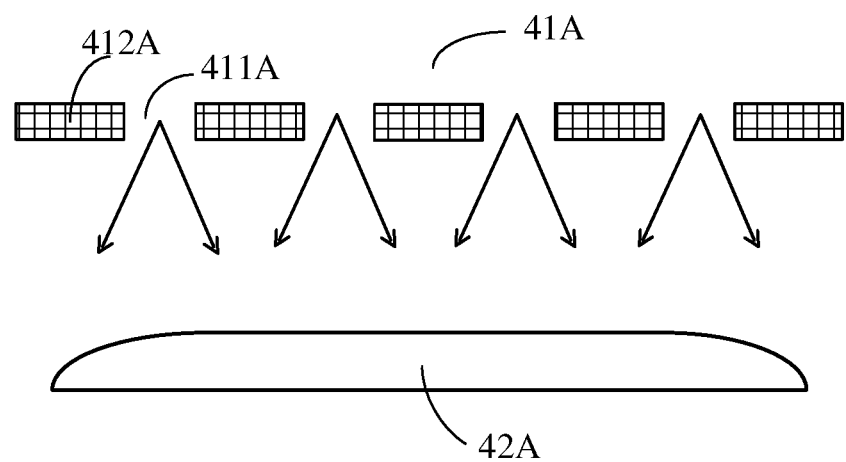
FIG. 4A is a schematic diagram of exposing a substrate with a mask plate to form a color resist block in the related art.
Figure 4B:
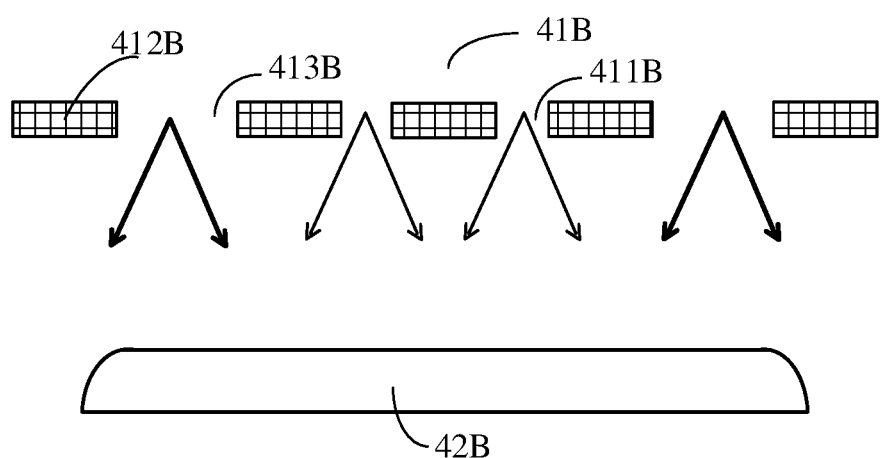
FIG. 4B is a schematic diagram of exposing a substrate with a mask plate to form a color resist block in the present disclosure.

Referring to FIG. 4A and FIG. 4B, FIG. 4A is a schematic diagram of exposing a substrate with a mask plate to form a color resist block in the related art, and FIG. 4B is a schematic diagram of exposing a substrate with a mask plate to form a color resist block in the present disclosure. As shown in FIG. 4A, in the related art, two adjacent light-transmitting regions 411A are arranged on a mask plate 41A, and are spaced apart by a mask region 412A. Each light-transmitting region 411A is a same shape of a rectangular opening, i.e., an area of each light-transmitting region 411A is the same. In addition, a distance between the two adjacent light-transmitting regions 411A is also the same. During a process of partially exposing the mask plate 41A to form a color resist block 42A, energy of both edges of the color resist block 42A irradiated by ultraviolet light is lower than energy of a middle of the color resist block 42A irradiated by the ultraviolet light, so that the middle of the color resist block 42A formed is thick but the both edges of the color resist block 42A formed is thin. An angle between a side surface of the edge of the color resist block 42A and a bottom surface is less than 70 degrees, so that the color resist block 42A is easy to be peeled off. As shown in FIG. 4B, in the present disclosure, two adjacent light-transmitting regions may be arranged on a mask plate 41B, and may be spaced apart by a mask region 412B. A second light-transmitting region 413B may be located at two sides of the mask plate 41B, and a first light-transmitting region 411B may be located in a middle of the mask plate 41B. In addition, an area of a rectangular corresponding to the second light-transmitting region 413B may be greater than an area of a rectangular corresponding to the first light-transmitting region 411B in a direction of a surface of the mask plate. During the process of partially exposing the mask plate 41B to form a color resist block 42B, energy of both edges of the color resist block 42B irradiated by ultraviolet light may be not lower than energy of a middle of the color resist block 42B irradiated by the ultraviolet light, so that the color resist block 42B having a uniform thickness may be formed. An angle between a side surface of the edge of the color resist block 42B and a bottom surface may be no less than 70 degrees and may be less than 90 degrees, so that the color resist block 42B may be not easy to be peeled off.

In the present embodiment, the color resist block may be a blue color resist block. In other embodiments, the color resist block may also be a red color resist block or a green color resist block.

Figure 5:
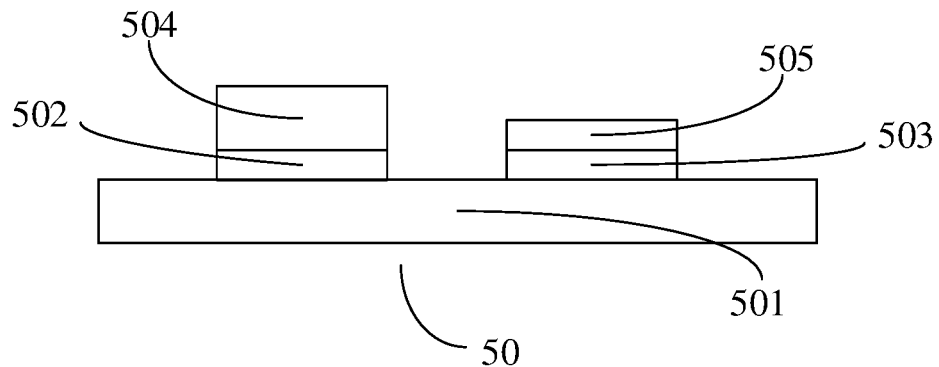
FIG. 5 is a structural illustration of an array substrate in accordance with an embodiment in the present disclosure.

Referring to FIG. 5, FIG. 5 is a structural illustration of an array substrate in accordance with an embodiment in the present disclosure. In the present embodiment, a array substrate 50 may comprise a substrate 501, a first thin film transistor 502 and a second thin film transistor 503 on the substrate 501, a first color resist block 504 on the first thin film transistor 502, and a second color resist block 505 on the second thin film transistor 503. The first color resist block 504 on the first thin film transistor 502 may be formed by a full exposure. The second color resist block 505 located on the second thin film transistor 503 may be formed by a partial exposure with the mask plate of the present disclosure.

In the present embodiment, the substrate 501 may be a glass substrate. In other embodiments, the substrate 501 may be a substrate made of other materials.

In the present embodiment, the first thin film transistor 502 and the second thin film transistor 503 may comprise a gate layer, a gate insulating layer on the gate layer, an active layer on the gate insulating layer, a source and a drain and a passivation layers on the active layer.

In the present embodiment, the color resist block may be a blue color resist block. In other embodiments, the color resist block may also be a red color resist block or a green color resist block.

As compared with the related art, the present disclosure may provide a mask plate comprising at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate. So that exposure intensity in the edges of the color resist block may be enhanced, thereby the thickness of the edge of the color resist block may be increased, to prevent the color resist block from being peeled off, and the display quality of a liquid crystal panel may be improved.

Figure 6:
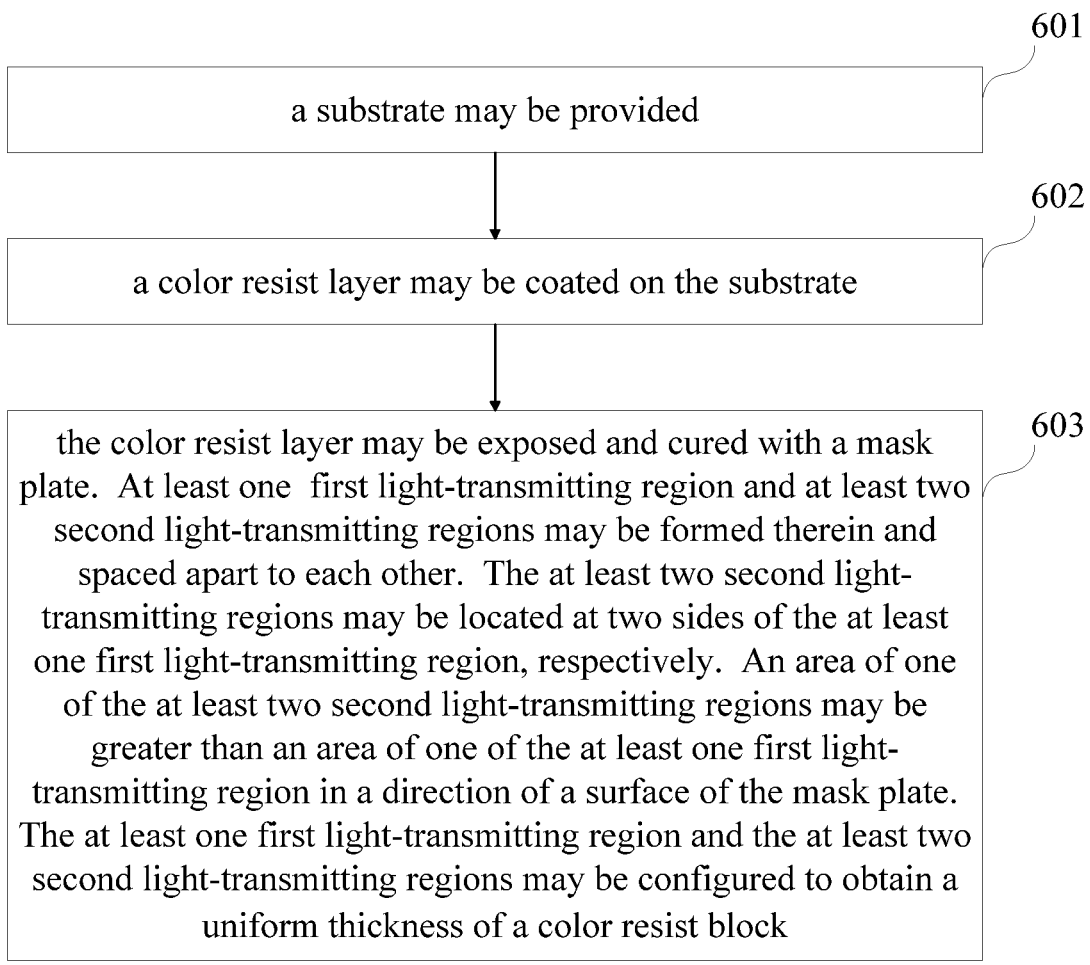
FIG. 6 is a flow chart of a preparation method for an array substrate in accordance with an embodiment in the present disclosure.

Referring to FIG. 6, FIG. 6 is a flow chart of a preparation method for an array substrate in accordance with an embodiment in the present disclosure.

Block 601: a substrate may be provided;

In the present embodiment, a glass substrate may be selected. The glass substrate may be cut to be an appropriate size, cleaned by acetone, deionized water, and alcohol, and then dried in a nitrogen environment. In other embodiments, the substrate may be a substrate made of other materials.

Block 602: a color resist layer may be coated on the substrate.

A thin film transistor may be coated on the glass substrate obtained in block 601, and a color resist layer may be coated on the thin film transistor.

In the present embodiment, the thin film transistor may comprise a gate layer, a gate insulating layer on the gate layer, an active layer on the gate insulating layer, a source and a drain and a passivation layers on the active layer.

In the present embodiment, the color resist layer coated on thin film transistor may be a blue color resist block. In other embodiments, the color resist layer coated on thin film transistor may also be a red color resist block or a green color resist block.

Block 603: the color resist layer may be exposed and cured with a mask plate. At least one first light-transmitting region and at least two second light-transmitting regions may be formed therein and spaced apart to each other. The at least two second light-transmitting regions may be located at two sides of the at least one first light-transmitting region, respectively. An area of one of the at least two second light-transmitting regions may be greater than an area of one of the at least one first light-transmitting region in a direction of a surface of the mask plate. The at least one first light-transmitting region and the at least two second light-transmitting regions may be configured to obtain a uniform thickness of a color resist block.

The color resist block coated in block 602 may be exposed, developed, and cured with the mask plate in the present disclosure to obtain a color resist block having a uniform thickness.

An angle between a side surface of the color resist block having a uniform thickness and a bottom surface of the color resist block may be not less than 70 degrees and less than 90 degrees.

In the present embodiment, a distance between the two adjacent second light-transmitting regions may be greater than a distance between the two adjacent first light-transmitting regions, and a distance between the second light-transmitting region and the adjacent first light-transmitting region may be greater than the distance between the two adjacent first light-transmitting regions. The first light-transmitting region and the second light-transmitting region may have a rectangular opening with a same length. A width of the second light-transmitting region may be in a range of 4 to 10 micrometers. The distance between the two adjacent second light-transmitting regions may be in a range of 6 to 10 micrometers. The distance between the second light-transmitting region and the adjacent first light-transmitting region may be in a range of 6 to 10 micrometers.

The present disclosure provides an array substrate comprising a color resist block. An angle between a side surface of the color resist block and a bottom surface of the color resist block may be no less than 70 degrees and less than 90 degrees.

As compared with the related art, the present disclosure may provide a mask plate comprising at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate. So that exposure intensity in the edges of the color resist block may be enhanced, thereby the thickness of the edge of the color resist block may be increased, to prevent the color resist block from being peeled off, and the display quality of a liquid crystal panel may be improved.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A mask plate, comprising:
   at least one first light-transmitting region and at least two second light-transmitting regions formed therein and spaced apart to each other; the at least two second light-transmitting regions being located at two sides of the at least one first light-transmitting region, respectively; an area of one of the at least two second light-transmitting regions being greater than an area of one of the at least one first light-transmitting region in a direction of a surface of the mask plate; wherein each first light-transmitting region is a rectangular opening, and each second light-transmitting region is also a rectangular opening with a length same to that of the first light-transmitting region, wherein a width of the second light-transmitting region is in a range of 4 to 10 micrometers, the distance between one of the second light-transmitting regions and a corresponding one adjacent second light-transmitting region or a corresponding one adjacent light-transmitting region is in a range of 6 to 10 micrometers.

2. The mask plate according to claim 1, wherein a distance between two adjacent second light-transmitting regions is greater than that between two adjacent first light-transmitting regions, or a distance between one of the second light-transmitting regions and a corresponding one adjacent first light-transmitting region is greater than that between the two adjacent first light-transmitting regions.

3. The mask plate according to claim 1, wherein a distance between two adjacent second light-transmitting regions, a distance between two adjacent first light-transmitting regions, and a distance between one of the second light-transmitting regions and a corresponding one adjacent first light-transmitting region, are same.

4. The mask plate according to claim 1, wherein the at least two second light transmitting regions are symmetrical two sides with respect to a centerline of the mask plate.

5. The mask plate according to claim 1, wherein each first light-transmitting region and each second light-transmitting region are all with a shape selected from the group consisting of circular, diamond, and hexagonal.

6. The mask plate according to claim 1, wherein the mask plate is a chrome metal mask plate.

* * * * *